(12) United States Patent
Zhao et al.

(10) Patent No.: US 10,412,479 B2
(45) Date of Patent: Sep. 10, 2019

(54) HEADSET MANAGEMENT BY MICROPHONE TERMINAL CHARACTERISTIC DETECTION

(71) Applicant: Cirrus Logic International Semiconductor Ltd., Edinburgh (GB)

(72) Inventors: Xin Zhao, Austin, TX (US); Bradley A. Lambert, Austin, TX (US); Xiaofan Fei, Austin, TX (US); Eric J. Swanson, Buda, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 67 days.

(21) Appl. No.: 15/154,350

(22) Filed: May 13, 2016

(65) Prior Publication Data

US 2017/0019725 A1    Jan. 19, 2017

Related U.S. Application Data

(60) Provisional application No. 62/193,750, filed on Jul. 17, 2015.

(51) Int. Cl.
*H04R 1/10* (2006.01)
*H04R 5/04* (2006.01)
(Continued)

(52) U.S. Cl.
CPC ......... *H04R 1/1041* (2013.01); *G06F 1/3215* (2013.01); *G06F 1/3287* (2013.01);
(Continued)

(58) Field of Classification Search
CPC ...... H04R 1/1041; H04R 1/08; H04R 1/1016; H04R 5/04; H04R 29/004;
(Continued)

(56) References Cited

U.S. PATENT DOCUMENTS

| 5,640,450 A | 6/1997 | Watanabe |
| 5,946,391 A | 8/1999 | Dragwidge et al. |

(Continued)

FOREIGN PATENT DOCUMENTS

| GB | 2509316 A | 7/2014 |
| WO | WO 1999011045 A1 | 3/1999 |
| WO | WO 2008100919 A2 | 8/2008 |

OTHER PUBLICATIONS

Anonymous, "Freescale Semiconductor MC13783 Data Sheet: Technical Data", downloaded from http://cache.nxp.com/files/rf_if/doc/data_sheet/MC13783.pdf?pspll=1 on Oct. 25, 2016, 50 pages (pp. 1-50 in pdf).

(Continued)

*Primary Examiner* — Ping Lee
(74) *Attorney, Agent, or Firm* — Mitch Harris, Atty at Law, LLC; Andrew M. Harris (57) ABSTRACT

A headset power management system provides robust and low-power operation by detecting various connection conditions by measuring a voltage at the microphone terminal with and without injection of current from the headset. A power management circuit controls an operating state of the headset using a microphone terminal voltage detector and can determine whether a short circuit is present indicating a connection to a device that does not have a microphone input, a negative polarity voltage is present indicating that the device may be determining a connection and type of the headset using the microphone terminal, a normal connection, or whether the headset is not connected to a device at all. Depending on the connection state, some or all of the headset electronics may be disabled until a normal connection is detected. For example the microphone processing circuits may be disabled if the connection does not support a microphone input.

20 Claims, 5 Drawing Sheets

(51) Int. Cl.
| | |
|---|---|
| *H04M 1/60* | (2006.01) |
| *H03M 1/66* | (2006.01) |
| *H03M 1/12* | (2006.01) |
| *G06F 1/3287* | (2019.01) |
| *G06F 3/16* | (2006.01) |
| *G06F 1/3215* | (2019.01) |

(52) U.S. Cl.
CPC .............. *G06F 3/165* (2013.01); *H03M 1/12* (2013.01); *H03M 1/66* (2013.01); *H04M 1/6058* (2013.01); *H04R 5/04* (2013.01); *H04R 2201/107* (2013.01); *H04R 2420/05* (2013.01); *H04R 2460/03* (2013.01); *Y02D 10/171* (2018.01)

(58) Field of Classification Search
CPC .......... H04R 2201/107; H04R 2460/03; H04R 2420/05; H04M 1/6058; G06F 1/3215; G06F 1/3287; G06F 3/165; H03M 1/12; H03M 1/66; Y02D 10/171
See application file for complete search history.

(56) References Cited

U.S. PATENT DOCUMENTS

| | | | |
|---|---|---|---|
| 6,768,795 | B2 | 7/2004 | Feltstrom et al. |
| 6,850,617 | B1 | 2/2005 | Weigand |
| 7,010,332 | B1 | 3/2006 | Irvin et al. |
| 7,142,894 | B2 | 11/2006 | Ichikawa et al. |
| 7,330,739 | B2 | 2/2008 | Somayajula |
| 7,450,726 | B2 | 11/2008 | Goyal |
| 7,564,966 | B2 | 7/2009 | Sano |
| 7,620,432 | B2 | 11/2009 | Willins et al. |
| 7,668,308 | B1 | 2/2010 | Wurtz |
| 7,836,216 | B2 | 11/2010 | Kashi et al. |
| 7,903,825 | B1 | 3/2011 | Melanson |
| 7,912,501 | B2 | 3/2011 | Johnson et al. |
| 8,019,050 | B2 | 9/2011 | Mactavish et al. |
| 8,150,046 | B2 | 4/2012 | Hansson et al. |
| 8,213,625 | B2 | 7/2012 | Yamkovoy et al. |
| 8,222,641 | B2 | 7/2012 | Yamkovoy et al. |
| 8,290,537 | B2 | 10/2012 | Lee et al. |
| 8,379,873 | B2 | 2/2013 | Yamkovoy |
| 8,379,884 | B2 | 2/2013 | Horibe et al. |
| 8,629,580 | B2 | 1/2014 | Johnson et al. |
| 8,655,007 | B2 | 2/2014 | Hansson et al. |
| 8,718,296 | B2 | 5/2014 | Chang |
| 8,861,743 | B2 | 10/2014 | Pantfoerder et al. |
| 9,142,205 | B2 | 9/2015 | Alderson et al. |
| 9,202,455 | B2 | 12/2015 | Park et al. |
| 9,210,500 | B2 | 12/2015 | Allen et al. |
| 9,215,521 | B2 | 12/2015 | Lee |
| 2001/0053228 | A1 | 12/2001 | Jones |
| 2008/0170725 | A1* | 7/2008 | Asada ................. H04R 1/1041 381/107 |
| 2010/0172522 | A1* | 7/2010 | Mooring ............. H04R 1/1041 381/311 |
| 2012/0263313 | A1 | 10/2012 | Yu et al. |
| 2013/0020882 | A1 | 1/2013 | Prentice |
| 2013/0142350 | A1 | 6/2013 | Larsen et al. |
| 2013/0158919 | A1 | 6/2013 | Shah et al. |
| 2015/0256660 | A1 | 9/2015 | Kaller et al. |
| 2016/0127815 | A1* | 5/2016 | Ookuri .................... H04R 1/06 381/119 |

OTHER PUBLICATIONS

Anonymous, "MAX14627 / MAX 14628 Low-Power Headset Detectors with SEND/END Button Support" downloaded from http://datasheets.maximintegrated.com/en/ds/MAX14627-MAX14628.pdf on Oct. 25, 2016, 16 pages (pp. 1-16 in pdf).

International Search Report and Written Opinion of the International Searching Authority in PCT/US2016/039751, dated Oct. 14, 2016, 15 pages (pp. 1-15 in pdf).

Black, John W., "An Application of Side-Tone in Subjective Tests of Microphones and Headsets", Project Report No. NM 001 064.01.20, Research Report of the U.S. Naval School of Aviation Medicine, Feb. 1, 1954, 12 pages (pp. 1-12 in pdf), Pensacola, FL, US.

Peters, Robert W., "The Effect of High-Pass and Low-Pass Filtering of Side-Tone Upon Speaker Intelligibility", Project Report No. NM 001 064.01.25, Research Report of the U.S. Naval School of Aviation Medicine, Aug. 16, 1954, 13 pages (pp. 1-13 in pdf), Pensacola, FL, US.

Lane, et al., "Voice Level: Autophonic Scale, Perceived Loudness, and the Effects of Sidetone", The Journal of the Acoustical Society of America, Feb. 1961, pp. 160-167, vol. 33, No. 2., Cambridge, MA, US.

Liu, et al., "Compensatory Responses to Loudness-shifted Voice Feedback During Production of Mandarin Speech", Journal of the Acoustical Society of America, Oct. 2007, pp. 2405-2412, vol. 122, No. 4.

Paepcke, et al., "Yelling in the Hall: Using Sidetone to Address a Problem with Mobile Remote Presence Systems", Symposium on User Interface Software and Technology, Oct. 16-19, 2011, 10 pages (pp. 1-10 in pdf), Santa Barbara, CA, US.

Therrien, et al., "Sensory Attenuation of Self-Produced Feedback: The Lombard Effect Revisited", PLOS ONE, Nov. 2012, pp. 1-7, vol. 7, Issue 11, e49370, Ontario, Canada.

International Preliminary Report on Patentability in PCT/US2016/039751 dated Feb. 1, 2018, 9 pages (pp. 1-9 in pdf).

* cited by examiner

HEADSET MANAGEMENT BY MICROPHONE TERMINAL CHARACTERISTIC DETECTION

BACKGROUND OF THE INVENTION

1. Field of the Invention

The present invention relates generally to circuits for personal audio devices such as wireless telephones and media players, and more specifically, to circuits and methods that manage circuits within a disconnectable headset based on characteristics detected at the microphone terminal of the headset.

2. Background of the Invention

Disconnectable headsets are frequently used with wireless telephones, personal media players, and other devices that provide connections for the headsets. Recently, headsets have incorporated active electronics for such applications as ambient noise cancelling, and also include their own power source, typically a battery included within either the headset, or a dongle disposed along the headset cable.

As with other battery-operated equipment, when energy is not actually being used, e.g., when the headset is disconnected or the audio device is inactive, it is desirable to place at least a portion of the headset in a power-down mode in order to conserve battery energy. Further, battery-powered headsets typically include gain stages and have a higher input impedance, so open connections of a disconnected headset, or a connected headset that has not been properly configured with the device to which the headset is connected may generate audible noise.

Therefore, it would be desirable to provide a headset that provides power management of headset electronics without generating audible interference.

SUMMARY OF THE INVENTION

The above stated objectives of providing management of headset electronics to conserve battery power and avoid generation of audible noise is provided in a circuit within a headset, an integrated circuit, and methods of operation of the circuit.

The circuit includes a power management control circuit that controls an operating state of the headset and a microphone terminal voltage detector for detecting a voltage on at least microphone terminal of the plug that is used to connect the headset to a consumer audio device output jack. The circuit also include an analog-to-digital converter (ADC) that converts at least one audio output signal supplied to the plug from the consumer audio device to at least one digital representation and at least one digital-to-analog converter (DAC) circuit for generating a transducer output signal. The power management control circuit controls an operating state of the ADC, and optionally an operating state of the DAC, in conformity with the detected voltage of the at least one microphone terminal.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present disclosure encompasses headsets such as earphones or headphones for connection to personal audio devices, such as wireless telephones, media players, and other consumer personal audio playback devices. The headsets detect connection, and in some instances a type of connection from a personal audio device and manage power consumption and noise blanking based on the connection and connection type.

Figure 1:
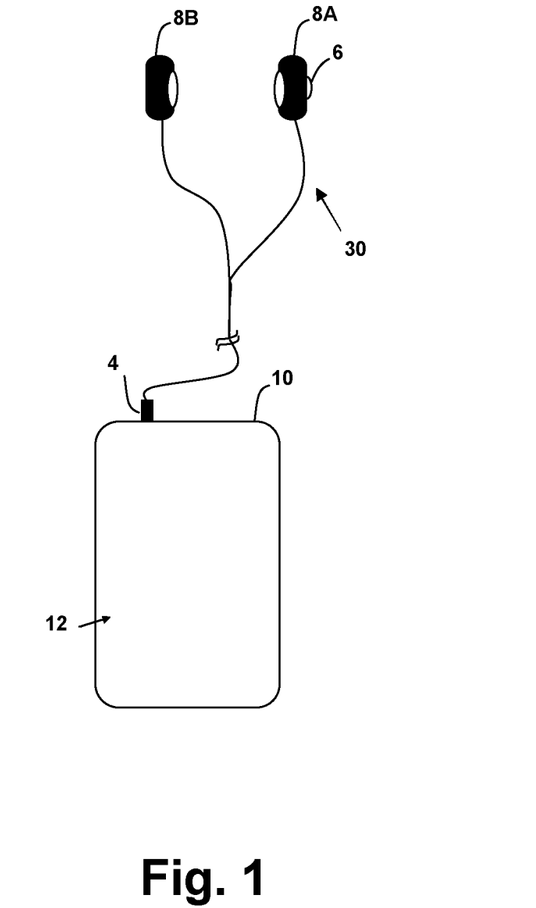
FIG. 1 is an illustration of a personal audio device 10 connected to a headset 30.

FIG. 1 shows an example of a personal audio device 10 connected to a headset 30 in the form of a pair of earbud speakers 8A and 8B, one of which includes a microphone element 6. Headset 30 is only exemplary, and it is understood that other types of headphones may be connected to personal audio device 10, including headphones, earbuds, in-ear earphones, and external speakers, any of which might incorporate features as disclosed herein. A standardized plug 4 provides for connection of headset 30 to personal audio device 10. While plug 4 is standardized in mechanical configuration, the connections of headset 30 and personal audio device 10 may vary between types. Also, the number of electrical contacts may vary between configurations, depending on how many transducers are included in headset 30 or how many transducers are expected for connection to a particular personal audio device 10. For example, by including one or more ring terminals disposed between the tip and shell (barrel) terminals of a phone type connector, the number of terminals can be changed, and as illustrated in the example below, headset 30 may determine that it is connected to a personal audio device 10 that only has terminals for output transducers, instead of including a microphone terminal.

Figure 2:
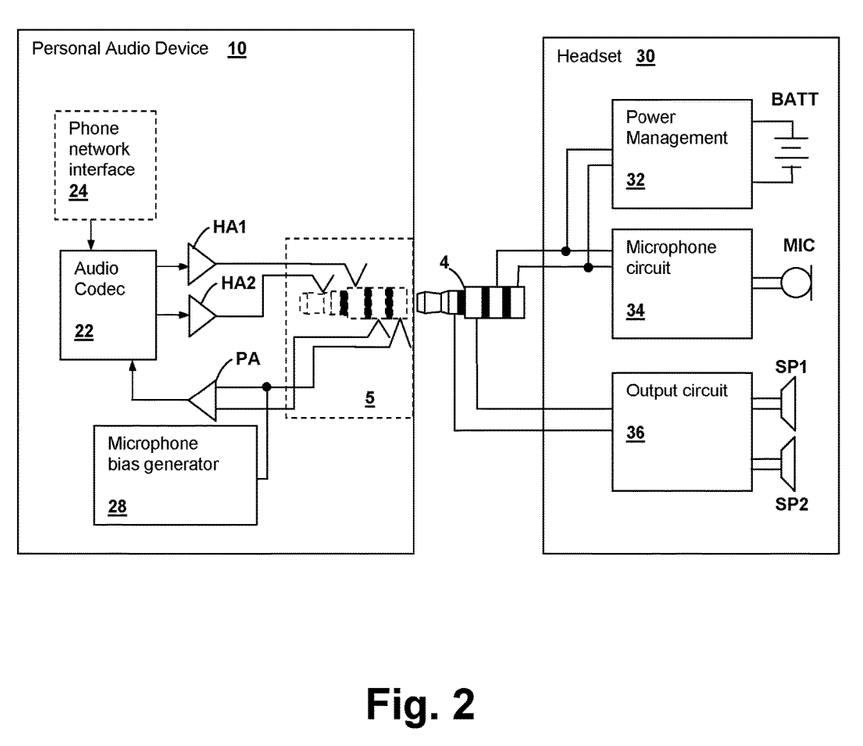
FIG. 2 is a block diagram depicting a connection between personal audio device 10 and headset 30.

FIG. 2 shows an example of circuits within personal audio device 10 and headset 30, showing the connections made by plug 4. Personal audio device 10 includes a jack (receptacle) 5 that receives plug 4 of headset 30. The two terminals at the tip of plug 4 are generally output connections from personal audio device 10, and are illustrated as provided from the outputs of headset amplifiers HA1 and HA2 that amplify the output of an audio codec 22 that generates output audio from, for example, stored audio data or downlink audio provided from a phone network interface circuit 24. The other two terminals receive connections from an external microphone forming part of headset 30. A microphone bias generator 28 provides a bias voltage to a microphone terminal 4A for operating a microphone circuit of an unpowered headset and a microphone preamplifier PA is provided to boost a signal level of audio received from an external microphone.

Exemplary headset 30 is a powered headset, operated by a battery BATT that is coupled through a power management block 32 to a microphone circuit 34 that processes signals from a microphone MIC and to an output circuit 36 that generates output audio signals for reproduction by transducers SP1 and SP2. Power management block 32 is also coupled to the microphone terminals of plug 4 and detects voltage levels on the microphone terminal 4A. Power management block 32 also injects current into microphone terminal 4A under certain conditions, in order to determine a type of connection provided by receptacle 5 of personal audio device and to determine whether plug 4 is connected to a receptacle of a device at all.

Figure 3:
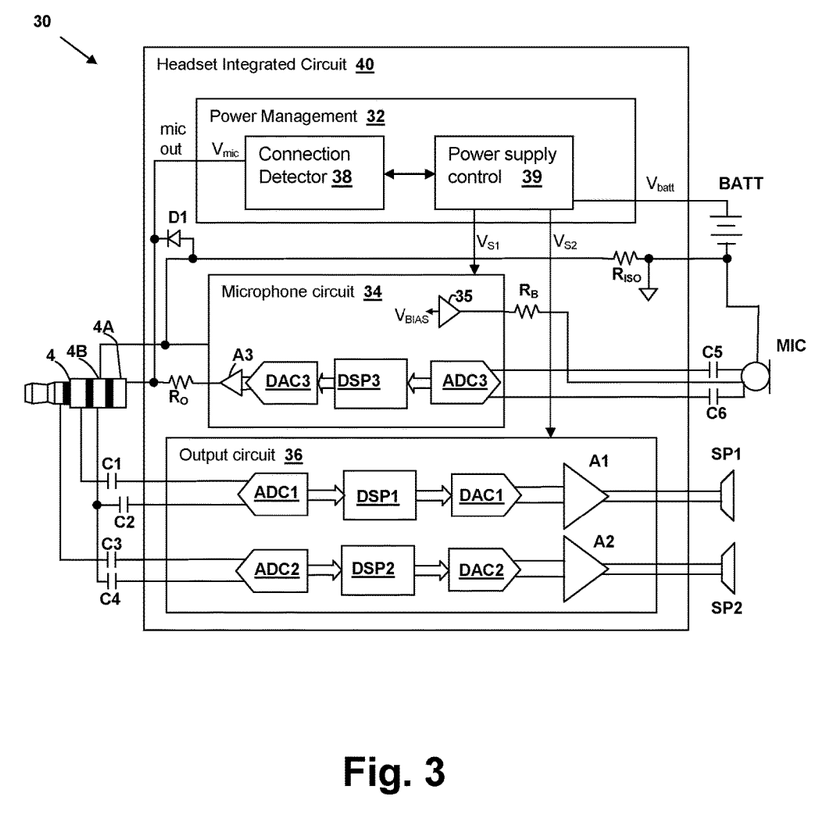
FIG. 3 is a simplified schematic diagram depicting internal circuits of headset 30.

FIG. 3 shows details of circuits within headset 30. A headset integrated circuit (IC) 40 incorporates power management block 32, microphone circuit 34 and output circuit 36. External to headset IC 40, capacitors C1-C4 provide AC-coupling of output signals from personal audio device 10 through plug 4 to the inputs of output circuit 36, which processes and amplifies the received signals for reproduction by transducers SP1 and SP2. Output circuit includes analog-to-digital converters (ADCs) ADC1 and ADC2, which convert the received signals to the digital domain. The converted values are processed by digital signal processors (DSPs) DSP1-DSP2, for example, to provide equalization, adaptive noise canceling, and other forms of signal processing. The processed audio is converted back to the analog domain by digital-to-analog converters (DACs) DAC1-DAC2 and amplified by amplifiers A1 and A2 to provide the output signals for driving transducers SP1 and SP2. The return current path for the audio input signals from plug 4 includes a resistor $R_{ISO}$ which is connected between a common terminal 4B of plug 4 and the negative terminal of battery BATT.

Microphone MIC is also AC-coupled to headset IC 40 by a pair of capacitors C5 and C6, but is DC-coupled to the reference (ground) terminal of a battery BATT that supplies operating power for headset 30 and to a mic bias circuit 35 via a resistor $R_B$, to supply operating voltage for microphone MIC, which is generally an electret-type condenser microphone. Microphone circuit 34 receives the output signal from microphone MIC at the inputs of an ADC ADC3, which converts the microphone signal to the digital domain and provides the converted audio information to another DSP DSP3 which processes the microphone signal and provides a digital output to a DAC DAC3. The output of DAC DAC3 is buffered by an amplifier A3 and provided to microphone terminal 4A of plug 4 via a resistor $R_O$. Amplifier A3 is referenced to terminal 4B of plug 4 via a connection to amplifier A3. As noted above, microphone terminal 4A is coupled to power management block 32 which measures and/or compares a voltage $V_{mic}$ of microphone terminal 4A at a connection detector 38, which provides an output to power supply control block 39. Power supply control block 39 controls power supplied to microphone circuit 34 and output circuit 36 by enabling and disabling supply voltages $V_{S1}$ and $V_{S2}$, respectively. Generally, supply voltage $V_{S2}$ is used to supply power to ADCs ADC1-ADC2, while power to DSPs DSP1-DSP2, DACs DAC1-DAC2 and amplifiers A1-A2 is supplied by the primary power supply $V_{DD}$ that is active when the headset is turned on, so that power is not wasted and noise is prevented by disabling ADCs ADC1-ADC2, but active noise canceling operations can be continued by output circuit 36. A diode D1 is provided to prevent external signals applied to microphone terminal 4A from becoming more negative than the forward-biased voltage drop of diode D1 ($\approx 0.7V$). Alternatively, control signals could be sent from power supply control block 39 to microphone circuit 34 and output circuit 36, i.e., in place of supply voltages $V_{S1}$ and $V_{S2}$, to set one both of microphone circuit 34 and output circuit 36 to a low power or power-down state. In such an implementation, the power supply inputs to microphone circuit 34 and output circuit 36 can be provided from primary power supply $V_{DD}$.

Figure 4:
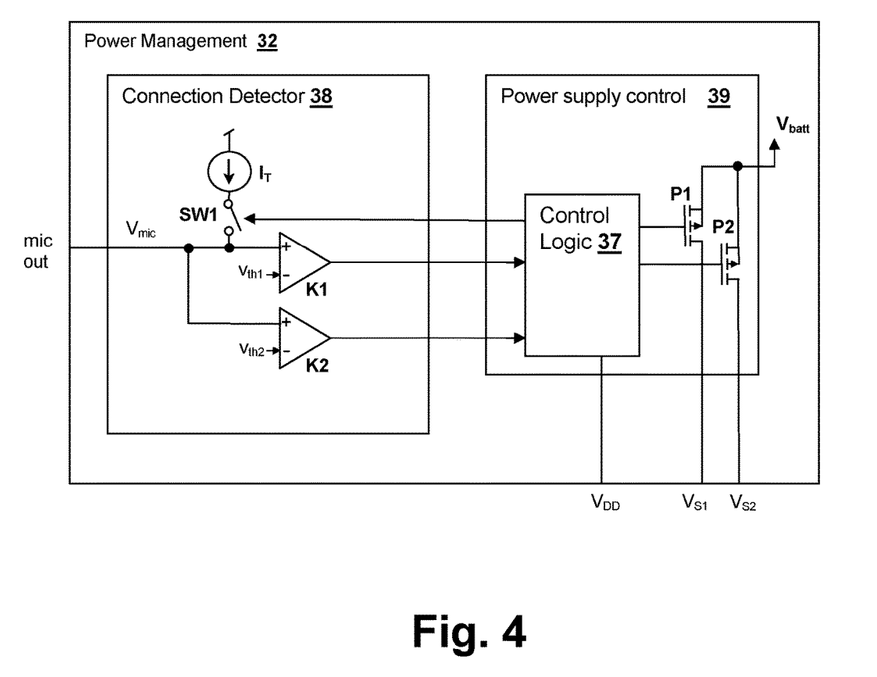
FIG. 4 is a simplified schematic diagram depicting details of power management block 32 of FIG. 3.

FIG. 4 shows details of an example power management block 32 including connection detector 38 and power supply control block 39. Connection detector 38 includes a comparator K1 that compares voltage $V_{mic}$ at microphone terminal 4A of plug 4 with a threshold voltage $V_{th1}$, which, in the example is 0.9V. Other comparators may optionally be provided to ensure that voltage $V_{mic}$ at microphone terminal 4A of plug 4 is less than a specified maximum, e.g., 1.35V. A current source $I_T$ is coupled to microphone terminal 4A by a switch SW1 that is controlled by a control signal provided from a control logic 37 within power supply control block 39. Control logic 37 also controls transistors P1 and P2 to enable and disable supply voltages $V_{S1}$ and $V_{S2}$, respectively. Table I below illustrates the relationship between voltage $V_{mic}$ at microphone terminal 4A of plug 4 and the connection type and state of plug 4. Switch SW1 is enabled to measure an impedance at microphone terminal 4A to determine whether plug 4 is disconnected or whether plug 4 is inserted in a jack of a device that does not have a microphone input, i.e., a headphone-only device. The magnitude of current source $I_T$ can be selected so that comparator K1 and threshold voltage $V_{th1}$ can be used to make the above-determination when switch SW1, as well as the determination of a normal headset connection when switch SW1 is open, or another comparator and threshold voltage may be provided, or threshold voltage $V_{th1}$ can be made programmable. Alternatively, connection detector 38 can be implemented by an ADC that provides a measurement of voltage $V_{mic}$ to logic or processor-executed algorithm that make the determinations described herein. Comparator K2 compares voltage $V_{mic}$ at microphone terminal 4A to another threshold voltage $V_{th2}$, which can be set to 0V or a negative voltage value to make the determination of whether or not plug 4 is connected to a device that is performing headset detection and therefore has reversed the polarity of the microphone bias voltage. Headset detection techniques such as the above are disclosed in U.S. Patent Publication US-20140050330-A1 entitled "HEADSET TYPE DETECTION AND CONFIGURATION TECHNIQUES", the disclosure of which is incorporated herein by reference.

TABLE I

| SW1 | $V_{mic}$ | Plug P4 connection state | P1/$V_{S1}$ state | P2/$V_{S2}$ state | Reason |
|---|---|---|---|---|---|
| Open | $V_{mic} > V_{th1}$ | Normal connection to headset | On | On | Normal Operation |
| Open | $V_{mic} < V_{th2}$ | Reversed connection possibly due to headset detection by personal audio device | Off | Off | Avoid noise from SP1, SP2 During headset detection |
| Closed | $V_{mic} < V_{th1}$ | Short to common terminal | Off | On | Headset connected to headset-only jack |

TABLE I-continued

| SW1 | $V_{mic}$ | Plug P4 connection state | P1/$V_{S1}$ state | P2/$V_{S2}$ state | Reason |
|---|---|---|---|---|---|
| Closed | $V_{mic} > V_{th1}$ | Open circuit | Off | Off | Headset disconnected, power down |

Figure 5:
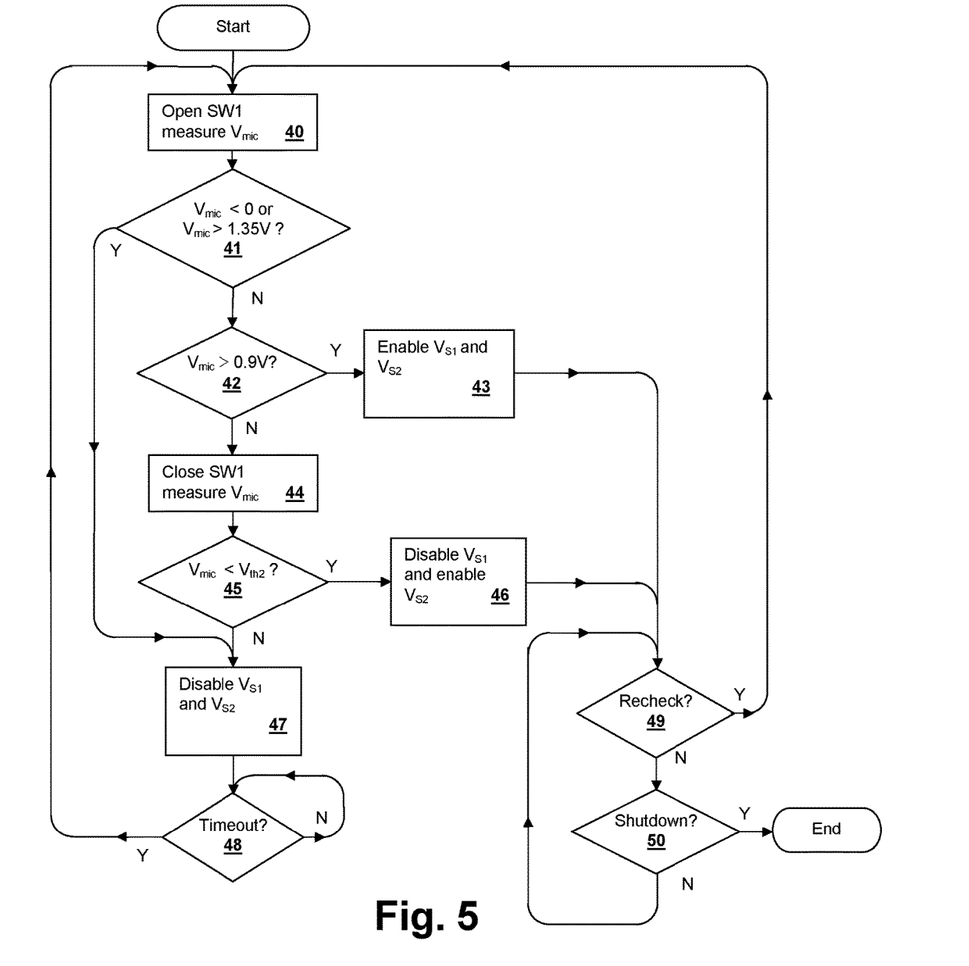
FIG. 5 is a flowchart depicting operation of a personal audio device.

FIG. 5 is a flowchart illustrating a headphone power management method as may be performed in the above-described headset. First switch S1 is set to the open state and microphone terminal voltage $V_{mic}$ is measured (step 40). If microphone terminal voltage $V_{mic}$ is less than 0V or greater than 1.35V (decision 41), supply voltages $V_{S1}$ and $V_{S2}$ are disabled (step 47). When a timeout occurs (decision 48), the process from step 40 is repeated again to determine again if microphone terminal voltage $V_{mic}$ is less than 0V or greater than 1.35V (decision 41). If microphone terminal voltage $V_{mic}$ is greater than 0V and less than 1.35V (decision 41), then if microphone terminal voltage $V_{mic}$ is greater than 0.9V (decision 42), supply voltages $V_{S1}$ and $V_{S2}$ are enabled (step 43). If microphone terminal voltage $V_{mic}$ is not greater than 0.9V (decision 42), then switch SW1 is closed to inject current from current source $I_T$ (step 44) and if microphone terminal voltage $V_{mic}$ is less than threshold voltage $V_{th2}$, then supply voltage $V_{S1}$ is disabled and supply voltage $V_{S2}$ is enabled (step 46), since microphone terminal 4A is presumed shorted to common terminal 4B. Otherwise if microphone terminal voltage $V_{mic}$ is greater than threshold voltage $V_{th2}$ (decision 45), then plug 4 is presumed disconnected and supply voltages $V_{S1}$ and $V_{S2}$ are disabled (step 46). Once the headset condition has been determined and the states of supply voltages $V_{S1}$ and $V_{S2}$ set, until a recheck is commenced (decision 49), which may be periodic or triggered by an event such as telephone conversation begin/end, a playlist track change, etc., the states of supply voltages $V_{S1}$ and $V_{S2}$ are maintained. If a recheck is commenced (decision 49) and until headset is shutdown (decision 50), steps 40-48 are repeated.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A headset for connection to a consumer audio device output jack, the headset comprising:
   a plug for connection to the consumer audio device output jack, the plug including at least one output terminal for receiving at least one audio output signal and at least one microphone terminal for coupling to an audio input terminal of the consumer audio device output jack, and a common terminal;
   at least one output transducer for generating an acoustic output from at least one audio transducer output signal;
   an audio output circuit including at least one analog-to-digital converter for converting the at least one audio output signal to at least one digital representation and at least one digital-to-analog converter circuit for generating the at least one transducer output signal, wherein the audio output circuit further comprises a digital signal processor coupled to an output of the analog-to-digital converter and coupled to an input of the digital-to-analog converter circuit, wherein the digital signal processor receives the at least one digital representation and generates a digital output provided to the input of the digital-to-analog converter circuit from the at least one digital representation;
   a microphone element for generating a microphone signal;
   a microphone input circuit for amplifying the microphone signal and providing an amplified microphone signal to the at least one microphone terminal;
   a battery for supplying a battery voltage to the audio output circuit and the microphone input circuit to power the audio output circuit and the microphone input circuit;
   a connection detector for detecting a presence of or an absence of a microphone bias voltage at the at least one microphone terminal and a presence of a short between the at least one microphone terminal and the common terminal; and
   a power management control circuit for controlling an operating state of the headset and having an input coupled to an output of the connection detector, wherein the power management control circuit controls a first power management state of the microphone input circuit and a second power management state of the audio output circuit, wherein the first power management state and the second power management state are independently selectable between at least a power-on state and a power-off state, wherein the power management control circuit controls the first power management state and the second power management state in conformity with the detected voltage of the at least one microphone terminal to control whether or not the battery voltage is applied to the microphone input circuit and the audio output circuit, wherein the power management control circuit sets the first power management state to the power-on state and the second power management state to the power-on state if the connection detector detects the presence of the microphone bias voltage at the at least one microphone terminal, wherein the power management control circuit sets the first power management state to the power-off state and the second power management state to the power-on state if the connection detector detects a short between the at least one microphone terminal and the common terminal.

2. The headset of claim 1, wherein the power management control circuit, in response to the connection detector detecting the absence of the microphone bias voltage and not detecting a short between the at least one microphone terminal and the common terminal, sets the second power management state to the power-on state.

3. The headset of claim 1, wherein the connection detector further detects a presence of an erroneous microphone bias voltage at the at least one microphone terminal, and wherein the power management control circuit, in response to detecting the presence of the erroneous microphone bias voltage, sets the second power management state to the power-off state.

4. The headset of claim 3,
wherein the power management control circuit further sets the first power management state to the power-off state in response to detecting the presence of the erroneous microphone bias voltage, wherein if the connection detector, in response to commencing a re-check, detects a presence of a correct microphone bias voltage at the at least one microphone terminal, the power management control circuit sets the first power management state to the power-on state and sets the second power management state to the power-on state.

5. The headset of claim 1, wherein the connection detector comprises:
a controllable current source for injecting a test current into the at least one microphone terminal; and
a voltage comparator for comparing a voltage at the at least one microphone terminal to a first threshold value to determine whether or not the voltage at the at least one microphone terminal is less than a first threshold value and sets the second power management state to the power-off state, and in response to the determining that the voltage at the at least one microphone terminal is greater than the first threshold value, sets the second power management state to the power-on state.

6. The headset of claim 5,
wherein the voltage comparator further compares the voltage at the at least one microphone terminal to a second threshold value that is less than the first threshold value indicating that a terminal of the consumer audio device output jack corresponding to the at least one microphone terminal is shorted to a return terminal of the consumer audio device output jack, and wherein the power management control circuit sets the first power management state to the power-off state and sets the second power management state to the power-on state in response to the connection detector detecting that the at least one microphone terminal is shorted to the return terminal.

7. The headset of claim 6, wherein the voltage comparator further compares the voltage at the at least one microphone terminal to a third threshold value that is greater than the first threshold value indicating that the voltage at the at least one microphone terminal is excessive, and wherein the power management control circuit sets the first power management state to the power-off state and sets the second power management state to the power-off state in response to the connection detector detecting that the voltage at the at least one microphone terminal is excessive.

8. A method for operating a headset connectable to a consumer audio device output jack, the method comprising:
detecting a presence or an absence of a microphone bias voltage on at least one microphone terminal of the headset and a presence of a short between the at least one microphone terminal and a common terminal with a connection detector, wherein the headset includes a plug for connection to the consumer audio device output jack, the plug including at least one output terminal for receiving at least one audio output signal, and wherein the at least one microphone terminal is a terminal for coupling to an audio input terminal of the consumer audio device output jack, and a common terminal;
generating a transducer output signal from the at least one audio output signal provided by the consumer audio device with an audio output circuit including an analog-to-digital converter that converts the at least one audio output signal provided by the consumer audio device at the consumer audio device output jack to a digital representation of the at least one audio output signal, wherein the audio output circuit includes at least one digital-to-analog converter circuit for generating the at least one transducer output signal from a digital output of a digital signal processor of the audio output circuit that is coupled to an output of the analog-to-digital converter and coupled to an input of the digital-to-analog converter circuit, wherein the digital signal processor receives the at least one digital representation and generates the digital output from the at least one digital representation;
generating a microphone signal;
amplifying the microphone signal and providing an amplified microphone signal to the at least one microphone terminal by a microphone circuit;
controlling an operating state of the headset in conformity with a result of the detecting, wherein the controlling controls a first power management state of the microphone input circuit and a second power management state of the audio output circuit, wherein the first power management state and the second power management state are independently selectable between at least a power-on state and a power-off state;
setting the first power management state to the power-on state and the second power management state to the power-on state if the connection detector detects the presence of the microphone bias voltage at the at least one microphone terminal;
setting the first power management state to the power-off state and the second power management state to the power-on state if the connection detector detects a short between the at least one microphone terminal and the common terminal; and
selectively supplying a battery voltage to the microphone input circuit and the audio output circuit depending on the result of the detecting and in conformity with the first power management state and the second power management state.

9. The method of claim 8, further comprising
setting the second power management state to the power-on state in response to the connection detector detecting the absence of the microphone bias voltage and not detecting a short between the at least one microphone terminal and the common terminal.

10. The method of claim 8, further comprising:
detecting a presence of an erroneous microphone bias voltage at the at least one microphone terminal; and
setting the second power management state to the power-off state in response to detecting the presence of the erroneous microphone bias voltage.

11. The method of claim 10, further comprising:
setting the first power management state to the power-off state in response to detecting the presence of the erroneous bias voltage with the power management control circuit;
detecting a presence of a correct microphone bias voltage at the at least one microphone terminal in response to commencing a re-check; and
setting the first power management state to the power-on state and setting the second power management state to the power-on state with the power management control circuit.

12. The method of claim 8, further comprising:
injecting a test current into the at least one microphone terminal with a controllable current source;

comparing a voltage at the at least one microphone terminal to a first threshold value to determine whether or not the voltage at the at least one microphone terminal is less than a first threshold value with a voltage comparator;

setting the second power management state to the power-off state; and setting the second power management state to the power-on state in response to the determining that the voltage at the at least one microphone terminal is greater than the first threshold value.

13. The method of claim 12, further comprising:

comparing the voltage at the at least one microphone terminal to a second threshold value that is less than the first threshold value indicating that a terminal of the consumer audio device output jack corresponding to the at least one microphone terminal is shorted to a return terminal of the consumer audio device output jack with the voltage comparator; and setting the first power management state to the power-off state and setting the second power management state to the power-on state in response to the connection detector detecting that the at least one microphone terminal is shorted to the return terminal with the power management control circuit.

14. The method of claim 13, further comprising comparing the voltage at the at least one microphone terminal to a third threshold value that is greater than the first threshold value indicating that the voltage at the at least one microphone terminal is excessive; and setting the first power management state to the power-off state and setting the second power management state to the power-off state in response to the connection detector detecting that the voltage at the at least one microphone terminal is excessive.

15. An integrated circuit for operating a headset connectable to a consumer audio device output jack, the integrated circuit comprising:

terminals for connection to a plug for connection to the consumer audio device output jack, the terminals including a common terminal, at least one output terminal for receiving at least one audio output signal and at least one microphone terminal for coupling to an audio input terminal of the consumer audio device output jack, and wherein the terminals further comprise at least one terminal for connection to a corresponding at least one output transducer for providing at least one audio transducer output signal to the corresponding transducer;

an audio output circuit including at least one analog-to-digital converter for converting the at least one audio output signal to at least one digital representation and at least one digital-to-analog converter circuit for generating the at least one transducer output signal, wherein the audio output circuit further comprises a digital signal processor coupled to an output of the analog-to-digital converter and coupled to an input of the digital-to-analog converter circuit, wherein the digital signal processor receives the at least one digital representation and generates a digital output provided to the input of the digital-to-analog converter circuit from the at least one digital representation;

a microphone input circuit for receiving and amplifying a microphone signal from a microphone input and providing an amplified microphone signal to the at least one microphone terminal;

a battery terminal for receiving a battery voltage from an external battery, wherein the battery terminal supplies the battery voltage to the audio output circuit and the microphone input circuit to power the audio output circuit and the microphone input circuit;

a connection detector for detecting a presence or an absence of a microphone bias voltage at the at least one microphone terminal and a presence of a short between the at least one microphone terminal and the common terminal; and a power management control circuit for controlling an operating state of the headset and having an input coupled to an output of the connection detector, wherein the power management control circuit controls a first power management state of the microphone input circuit and a second power management state of the audio output circuit, wherein the first power management state and the second power management state are independently selectable between at least a power-on state and a power-off state, wherein the power management control circuit controls the first power management state and the second power management state in conformity with the detected voltage of the at least one microphone terminal to control whether or not the battery voltage is applied to the microphone input circuit and the audio output circuit, wherein the power management control circuit sets the first power management state to the power-on state and the second power management state to the power-on state if the connection detector detects the presence of the microphone bias voltage at the at least one microphone terminal, wherein the power management control circuit sets the first power management state to the power-off state and the second power management state to the power-on state if the connection detector detects a short between the at least one microphone terminal and the common terminal.

16. The integrated circuit of claim 15, wherein the connection detector further detects a presence of an erroneous microphone bias voltage at the at least one microphone terminal, and wherein the power management control circuit, in response to detecting the presence of the erroneous microphone bias voltage, sets the second power management state to power-off state.

17. The integrated circuit of claim 16, wherein the power management control circuit further sets the first power management state to the power-off state in response to detecting the presence of the erroneous microphone bias voltage, wherein if the connection detector, in response to commencing a re-check, detects a presence of a correct microphone bias voltage at the at least one microphone terminal, the power management control circuit sets the first power management state to the power-on state and sets the second power management state to the power-on state.

18. The integrated circuit of claim 15, wherein the connection detector comprises:

a controllable current source for injecting a test current into the at least one microphone terminal; and a voltage comparator for comparing a voltage at the at least one microphone terminal to a first threshold value to determine whether or not the voltage at the at least one microphone terminal is less than a first threshold value and sets the second power management state to the power-off state, and in response to the determining that the voltage at the at least one microphone terminal is greater than the first threshold value, sets the second power management to the power-on state.

19. The integrated circuit of claim 18, wherein the voltage comparator further compares the voltage at the at least one microphone terminal to a second threshold value that is less than the first threshold value indicating that a terminal of the consumer audio device output jack corresponding to the at least one microphone terminal is shorted to a return terminal of the consumer audio device output jack, and wherein the power management control circuit sets the first power management state to the power-off state and sets the second power management state to the power-on state in response to the connection detector detecting that the at least one microphone terminal is shorted to the return terminal.

20. The integrated circuit of claim 19, wherein the voltage comparator further compares the voltage at the at least one microphone terminal to a third threshold value that is greater than the first threshold value indicating that the voltage at the at least one microphone terminal is excessive, and wherein the power management control circuit sets the first power management state to the power-off state and sets the second power management state to the power-off state in response to the connection detector detecting that the voltage at the at least one microphone terminal is excessive.

\* \* \* \* \*

UNITED STATES PATENT AND TRADEMARK OFFICE
CERTIFICATE OF CORRECTION

PATENT NO. : 10,412,479 B2
APPLICATION NO. : 15/154350
DATED : September 10, 2019
INVENTOR(S) : Zhao et al.

Page 1 of 1

It is certified that error appears in the above-identified patent and that said Letters Patent is hereby corrected as shown below:

In the Claims

Column 8, Line 16, Claim 8 "a microphone circuit" should read -- a microphone input circuit --.

Signed and Sealed this
Twenty-second Day of October, 2019

Andrei Iancu
*Director of the United States Patent and Trademark Office*